(12) United States Patent
Sabharwal (10) Patent No.: US 6,853,572 B1
(45) Date of Patent: Feb. 8, 2005

(54) METHODS AND APPARATUSES FOR A ROM MEMORY ARRAY HAVING TWISTED SOURCE OR BIT LINES

(75) Inventor: Deepak Sabharwal, New Delhi (IN)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 10/377,845

(22) Filed: Feb. 28, 2003

(51) Int. Cl.[7] .............................................. G11C 5/06
(52) U.S. Cl. ............... 365/63; 365/185.01; 365/185.13; 365/185.25; 365/226
(58) Field of Search .............................. 365/63, 185.01, 365/185.13, 185.25, 226

(56) References Cited

U.S. PATENT DOCUMENTS

| | | | |
|---|---|---|---|
| 5,668,752 A | 9/1997 | Hashimoto | |
| 5,723,883 A | 3/1998 | Gheewalla | |
| 5,898,194 A | 4/1999 | Gheewala | |
| 5,917,224 A | 6/1999 | Zangara | |
| 5,923,059 A | 7/1999 | Gheewala | |
| 5,923,060 A | 7/1999 | Gheewala | |
| 5,926,417 A * | 7/1999 | Chang | 365/185.26 |
| 6,002,607 A * | 12/1999 | Dvir | 365/103 |
| 6,069,382 A | 5/2000 | Rahim | |
| 6,091,090 A | 7/2000 | Gheewala | |
| 6,445,065 B1 | 9/2002 | Gheewala et al. | |
| 6,480,432 B1 * | 11/2002 | Nakayama | 365/201 |
| 6,617,621 B1 | 9/2003 | Gheewala et al. | |

* cited by examiner

Primary Examiner—Michael S. Lebentritt
Assistant Examiner—Pho M. Luu
(74) Attorney, Agent, or Firm—Blakely, Sokoloff, Taylor & Zafman, LLP (57) ABSTRACT

Various methods, apparatuses, and systems in which a read only memory is arrayed in a multiple rows and columns. A first column of memory cells is organized into groups of memory cells including a first group of memory cells and a second group of memory cells. A first source line connects to one or more memory cells in the first group of memory cells. The first source line changes its voltage state during a read operation on one or more bit cells in the first group. A second source line connects to one or more memory cells in the second group of memory cells. The second source line maintains its voltage state during the read operation.

20 Claims, 9 Drawing Sheets

METHODS AND APPARATUSES FOR A ROM MEMORY ARRAY HAVING TWISTED SOURCE OR BIT LINES

FIELD OF THE INVENTION

Embodiments of the invention generally relate to read only memories. More particularly, an aspect of an embodiment of the invention relates to a read only memory having a twisted source or a twisted bit line.

BACKGROUND OF THE INVENTION

The creation of wireless and mobile devices depend upon various key requirements, such as minimizing power usage. Power carries the heavy burden of impacting battery life on these portable devices. Maximizing the amount of battery life is very important while being able to maintain performance and minimize cost. Minimizing the use of power during a read operation is a disadvantage that several of the prior art ROM memory array have.

During a read operation a word line may be turned on to activate a bit cell to be read. If the bit cell being read is programmed as a logical zero, then the bit line discharges through the bit cell transistor. If the bit cell being read is programmed as a logical one, then the bit line should remain high. Sub-threshold leakage and Source line to bit line coupling can prevent a bit line from staying high.

Sub-threshold leakage may occur in unselected/not read bit cells programmed as zero's that are coupled between the same bit line and source line. The bit cells that share a common bit line and source line may have leakage current from the high-voltage bit line through the unread bit cells to the low voltage source lines even though the unread or unselected bit cells do not have a signal to turn on the gates of those bit cells. Alternatively, even if no transistor exists in an unread bit cell location such as in diffusion programming, then that unread bit cell location still may lose part of its permanent charge during a read operation on a neighboring bit cells, through the charge leaking from the bit line through its neighboring cell. The cumulative affect of large numbers of unselected transistors in a column of bit cells, such as 1,024, can cause a memory location with or even without a transistor at that bit cells location to lose part of its permanent charge during a read operation on the neighboring bit cells.

Even without leakage current, bit line coupling, electrical interference passing between the closely formed source line and bit line may occur from the high-voltage bit line to the low voltage source line. Source line to bit line coupling can cause a bit line to drop its voltage level. Periodically a bit line may be recharged and consume battery power to make up for this cumulative drop in voltage.

SUMMARY OF THE INVENTION

Various methods, apparatuses, and systems in which a read only memory is arrayed in a multiple rows and columns. A first column of memory cells is organized into groups of memory cells including a first group of memory cells and a second group of memory cells. A first source line connects to one or more memory cells in the first group of memory cells. The first source line changes its voltage state during a read operation on one or more bit cells in the first group. A second source line connects to one or more memory cells in the second group of memory cells. The second source line maintains its voltage state during the read operation.

BRIEF DESCRIPTION OF THE DRAWINGS

The drawings refer to embodiments of the invention in which.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set fourth, such as examples of specific data signals, named components, connections, number of memory cells in a group, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first source line, may be made. However, the specific numeric reference should not be interpreted as a literal sequential order but rather interpreted that the first source line is different than a second source line. Thus, the specific details set fourth are merely exemplary. The specific details may be varied from and still be contemplated to be within the spirit and scope of the present invention. The terms bit cell and memory cell may be used interchangeably.

In general, various methods, apparatuses, and systems in which a read only memory is arrayed in a multiple rows and columns is described. A first column of memory cells may be organized into groups of memory cells such as a first group of memory cells and a second group of memory cells. A first twisted source line connects to one or more memory cells in the first group of memory cells. The first twisted source line changes its voltage state during a read operation on one or more bit cells in the first group. A second twisted source line connects to one or more memory cells in the second group of memory cells. The second twisted source line maintains its voltage state during the read operation. The twisted geometry of the source lines breaks up the read only memory array to create subsections of memory cells within a first column of bit cells effected during a read operation.

Figure 1:
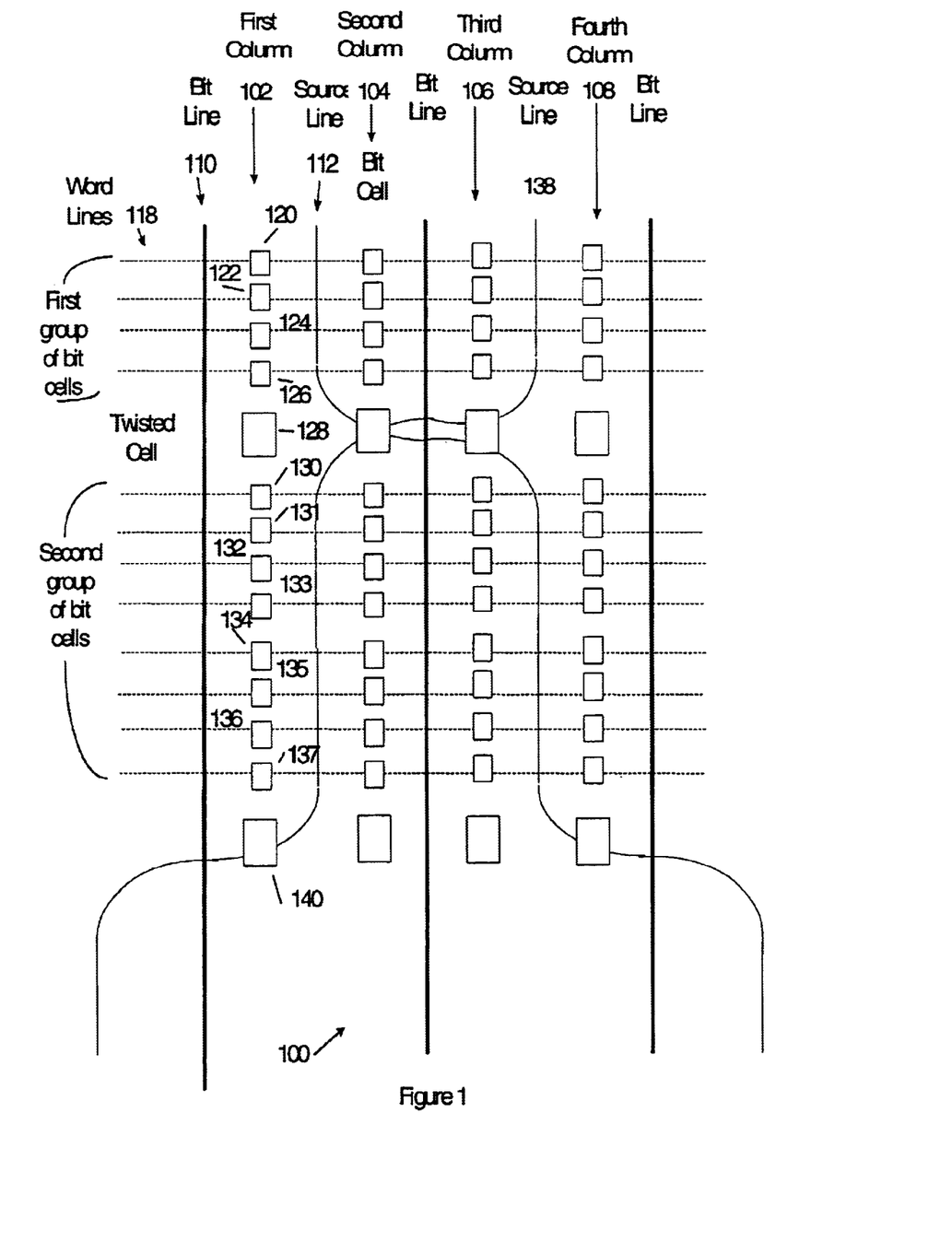
FIG. 1 illustrates a layout diagram of an embodiment of a read only memory (ROM) organized into groups of bit cells sharing a common bit line and connecting to a sectionally twisted source line.

FIG. 1 illustrates a layout diagram of an embodiment of a read only memory (ROM) organized into groups of bit cells sharing a common bit line and connecting to a sectionally twisted source line. The ROM array 100 may be organized into multiple vertical columns of bit cells including, for example, a first column 102, a second column 104, a third column 106, and a fourth column 108. In the first column 102, a first bit line 110 and a first source line 112 run vertically along the ROM memory array 100. The bit cells of the first column 102 are located in between the first bit line 110 and sections of various source lines. A source line may be twisted vertically along the memory array per each sectional group of bit cells. Word lines 118 trace horizontally across the ROM memory array 100 and connect to one or more bit cells in the various columns of bit cells.

Between the first bit line 110 and the first twisted source line 12 is a first group of bit cells including, for example, a first bit cell 120, a second bit cell 122, a third bit cell 124, and a fourth bit cell 126. A first twisted cell 128 is located in between a last bit cell 126 in the first group of memory cells and a beginning bit cell 130 in the second group of memory cells. The first twisted cell breaks the geometry of the ROM array 100 to create subsections of bit cells within a first column 102. A twisted cell may provide a location for routing of interconnections of the source lines to generate the twisted geometry of the source lines.

One or more bit cells 120–126 in the first group of bit cells may connect to the first twisted source line 112, the first bit line 110, or both. One or more bit cells 130–137 in a second group of bit cells may connect to the same first bit line 110. However, the memory cells 130–137 in the second group of bit cells may connect to a different twisted source line, such as the second source line 138, rather than first twisted source line 112. The twisting of the source lines creates small sub-sections of bit cells within each column of memory cells.

Note, in an embodiment, a memory cell may be programmed to store a logical one when both terminals of that cell connect to the same line, for example, the first source line 112 or the first bit line 110. A memory cell may be programmed to store a logical zero when one of the terminals of that cell connects to a source line and the other terminal connects to a bit line.

During standby operations bit lines and source lines may be held at the same potential, such as both being in a high voltage state. During an active read operation on a given bit cell, the corresponding source line is, for example, pulled low and word line is turned on. If the particular bit cell being read is programmed as a zero then the bit line discharges through the bit cell's transistor. If the bit cell is programmed as a one, then the bit line should remain high.

Yet, two phenomena may prevent the bit line of a bit cell programmed as a one from staying at a high voltage state during the read operation. Other bit cells that are programmed as zero's and share the same bit line and source line may have sub-threshold leakage current through their existing transistors. The cumulative effect of enough leakage current from these bit cells sharing the same bit line may cause the voltage level of that bit line to decrease to a point where it should be recharged. Also, source line to bit line coupling can cause an adjacent bit line to drop in voltage level. The effects of bit line coupling and leakage current may be calculated. Bit line coupling and leakage current can then minimized by creating smaller groups of bit cells effected during a read operation with use of twisted source lines.

When a read operation occurs on one or more bits cells in a memory column, then based on the address of the bit cell being read, the address decoder circuitry (not shown) activates a circuit to bring the voltage state of the source line low. For example, the first source line 112 changes its voltage state, such as from Vdd to Vss, during a read operation on one or more bit cells 120–126 in the first group that is programmed as a logical zero. The address circuitry also activates the word-line 118 going to the gate of the one or more bit cells being read in the memory array, such as the first bit cell 120.

Nonetheless, the second twisted source line 138 connected to one or more memory cells 130–137 in the second group of memory cells maintains its voltage state during the read operation on the memory cells 120–126 in the first group of memory cells. This way, stored charge in the second group of bit cells 130–137 in the first column of bit cells 102 is preserved during the read operation on a bit cell in the first group of memory cells 120–126 by pairing the first group of memory cells 120–126 to the first source line 112 and the second group of bit cells 130–137 to the second source line 138. Leakage current does not occur in the second group of bit cells 130–137 during the read operation on a memory cell in the first group of memory cells 120–126. The memory cells in the second group 130–137 will not have any leakage current because the first bit line 110 and the second source line 138 maintain their voltage state and thus no current leaks through bit cells programmed as a logical zero.

Also, the overall source to bit line coupling effect can be minimized by twisting the source line and creating small sub-sections of source lines being pull down low within each column. Merely, the small section of the twisted source line adjacent to a given bit line acts as a charge sink to that neighboring bit line.

The twist cell intervals are easily customizable to reduce leakage current and bit line coupling to acceptable levels. For example, the cumulative effect of leakage current in a large numbers of unselected transistors in a column of bit cells, such as 1,024, can cause a memory location with or even without a transistor at that bit cells location to lose part of its permanent charge during a read operation on the neighboring bit cells. However, if two twisted cells, such as the first twist cell 128 and the second twist cell 140, break the column of 1024 bit cells into three groups of memory cells within that column, then the leakage current during a read operation will be approximately a third of the leakage current experienced during a read operation with prior techniques.

A read operation of a memory cell in the second group of memory cells occurs in the same way as a read operation on a memory cell in the first group of memory cells. For example, during a read operation on a memory cell in the second group of memory cells, such as the fifth bit cell 130, the second source line 138 changes its voltage state during the read operation while the voltage state of the first source line 112 is maintained during the read operation. Thus, the second source line 138 connected to one or more cells in the second group of memory cells 130–137 changes its voltage logic state during a read operation on the one or more bit cells in the second group 130–137. However, the first source line 112 connected to the first group of memory cells 120–126 maintains its voltage logic state during that read operation.

A twisted cell, such as the second twisted cell 140, allows for a break in the geometry of the memory array in order to create the subsections within the columns of memory cells. The twisted cell may break a vertically running source line from, for example, a metal three level. The twisted cell would then connect that line to using a via to the metal two level. The first source line 112, for example, would then cross over on the metal two level from the second memory column 104 over to the third memory column 106. After being connected back up to the third metal layer using another via, the first source line 112 would then start vertically transiting down the third memory column 106.

Thus, the twisted cell allows for the geometrical displacement of the source line using the metal layers and the vias at the boundary of every section or grouping of bit cells. As noted, vias or similar component may be used to interconnect the source line running from the metal three layer down to the metal two layer and then back up from the metal two layer to the metal three layer. Note, the metal three layer, metal two layer and vias are only given as an example of one way that routing of the twisted source line can be accomplished.

Figure 2:
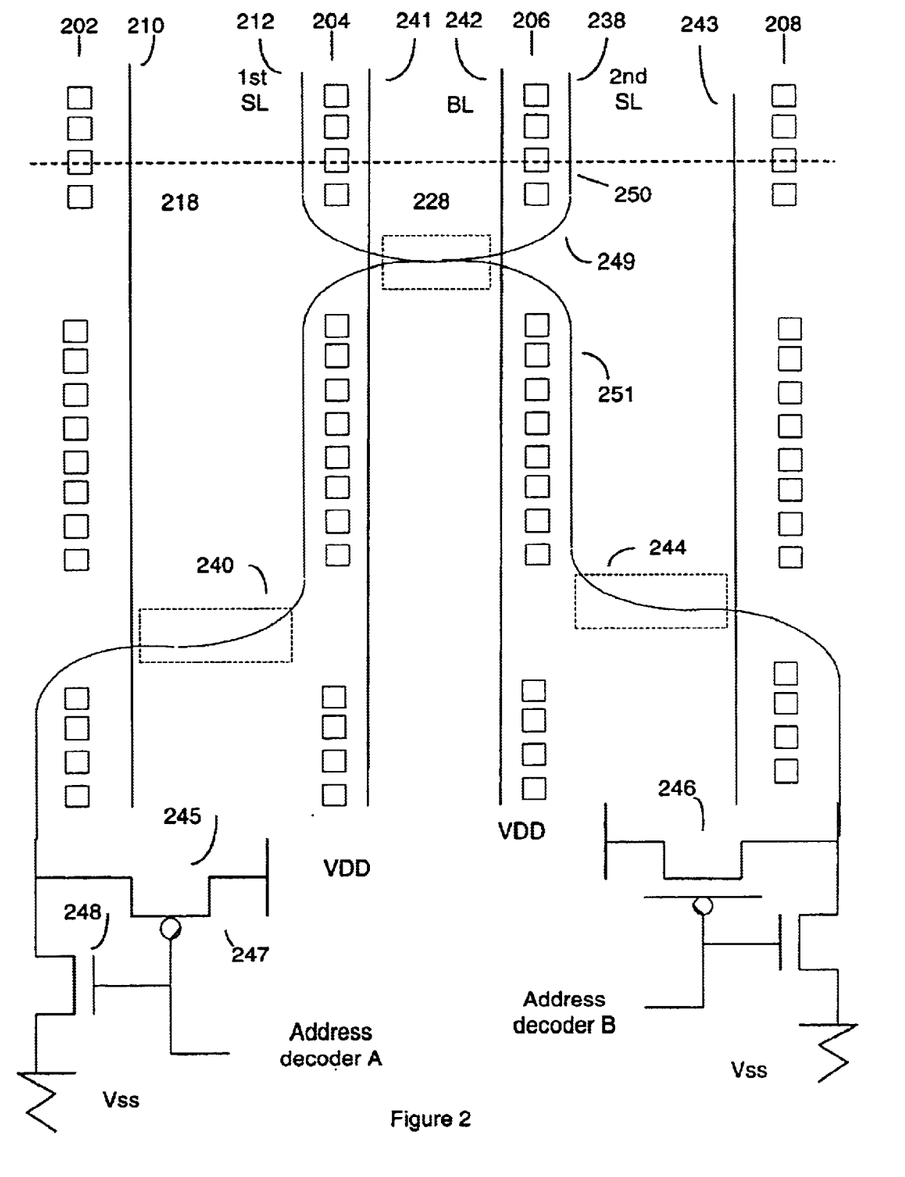
FIG. 2 illustrates a portion of a physical layout of an embodiment of a ROM memory array using twisted source lines.

FIG. 2 illustrates a portion of a physical layout of an embodiment of a ROM memory array using twisted source lines. The memory array includes four columns of memory cells 202–208, four bit lines a first bit line 210, a second bit line 241, a third bit line 242, and a fourth bit line 243, a first twisted source line 212, a second twisted source line 238, three twisted cells, a first twisted cell 228, a second twisted cell 240, and a third twisted cell 242, and groups of memory cells formed by the twisted source lines.

In this embodiment, the source line and the bit line may be held at a high voltage state such as VDD. Having both the bit line and source line when in standby at the same potential minimizes standby leakage current. The first circuit 245 and the second circuit 246 may use a virtual ground technique to switch the voltage state of the source line when reading a bit cells paired to that source line. When a signal comes from the address decoder to bring the second source line 238 to a low voltage state for a first group memory cells 249, then a control signal comes in to the first circuit 245 cutting off the transistor 247 supplying VDD. The signal from address decoder A turns on the transistor 248 in the first circuit 245 to connect Vss to the second source line 238.

Note, in some prior techniques the bit line and source line have a permanent nominal voltage, such as a high voltage state on the bit line and a low voltage state on the source line. In the virtual ground technique employed on a source line, the voltage state of the source line is switched from, for example, a high voltage state to a low voltage state.

When the second source line 238 is at low state, the third bit line 242 is in high voltage state, and the word line 218 going to the third bit cell 250 is turned on, then that bit cell is read. Leakage current may occur from any of the bit cells programmed as a logical zero in the first group memory cells 249 in that particular column of bit cells. However, leakage current will not occur from any of the bit cells in the second group of memory cells 251.

Similarly, when a bit cell is being read in the second group of memory cells 251, a signal comes from the address decoder B to the second circuit 246. The signal from address decoder B turns off the PMOS transistor connecting the first source line 112 to VDD and turns on the CMOS transistor connecting the first source line 112 to ground. Leakage current may occur from any of the bit cells programmed as a logical zero in group B in that particular column of bit cells because one of the bit cells is being read in the group B memory cells. However, leakage current will not occur in the group A memory cells.

Thus, if an example 1,024 memory column is divided up into four groups of memory cells, then the leakage current that could occurs in a memory cell can be divided into that fractional amount such as ¼ the amount of leakage current that occurs typically when a read operation occurs. The sectionalizing of the source line creates only small pockets where the electrical interference can occur from the small segments of the grounded source line to the high potential of the bit line. Thus, the overall interference that occurs between the grounded source line and the high-voltage bit line is reduced.

Figure 3:
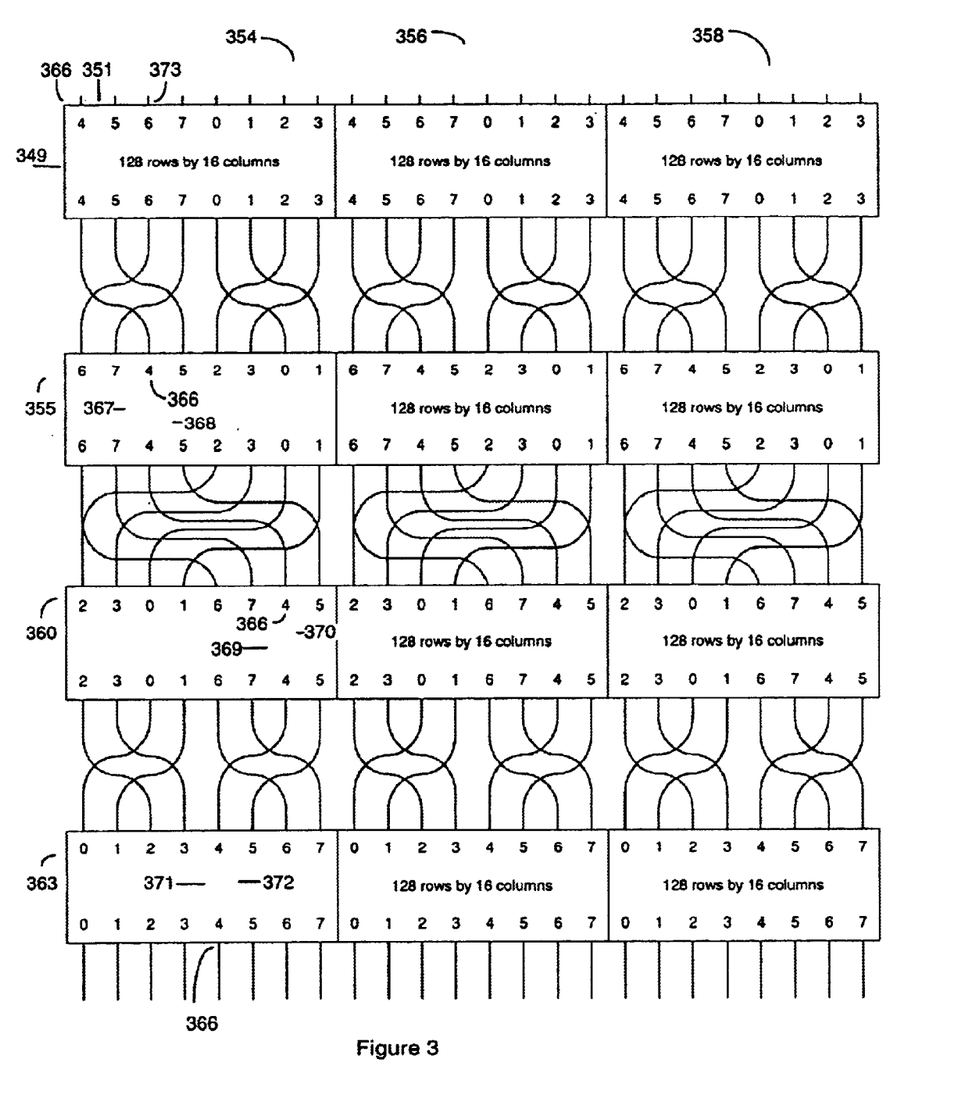
FIG. 3 illustrates a block diagram of an embodiment of a ROM memory array sectionalized by using source line twisting.

FIG. 3 illustrates a block diagram of an embodiment of a ROM memory array sectionalized by using source line twisting. The example ROM memory array 300 contains twelve sections of memory 354–365, each containing one hundred and twenty eight rows by sixteen columns of bit cells. Each section 354–365 of the ROM memory array 300 has eight source lines, labeled 0–7. The eight source lines may correspondingly pair up with the sixteen columns of memory cells. One hundred and twenty eight memory cells may be in each group of memory cells, such as the first group of memory cells 349, in each memory column. The various sections of memory cells 354–365 illustrate the routing of the twisted source line through these groups of memory cells.

For example, source line-4 366 exists in the upper left corner in the first section 354 of the ROM memory array 300. Source line-4 366 may connect to memory cells in the first group of bit cells 349 on the left side and memory cells in the second group of bit cells 351 on the right side. Source line-4 366 exits the first section of memory cells 354 and twists two positions horizontally to the right. In the first section of memory cells 354, source line-4 366 was the furthest source line to the edge.

Source line-4 366 in the fourth section of memory cells 355 is in between source line 7 and source line 5. Source line-4 366 may connect to memory cells in the third group of bit cells 367 on the left side and memory cells in the fourth group of bit cells 368 on the right side. Source line-4 366 exits the fourth section of memory cells 355 and, for example, shifts 4 positions horizontally to the right when connecting with the seventh section of memory cells 360.

Source line-4 366 is still positioned between source line 7 and source line 5 in the seventh section of memory cells 360; however, source line-4 366 is approximately at the right edge of the seventh section of memory cells 360. Source line-4 exits the seventh section of memory cells 360 and enters the tenth section of memory cells 363 approximately in the middle of that section of memory cells 360. Source line 4 is neighbored by source line 3 and source line 5 in the tenth section of memory cells 363. Source line-4 366 may connect to memory cells in the fifth group of bit cells 371 on the left side and memory cells in the fourth group of bit cells 372 on the right side.

The other twisted source lines may follow a similar example, for example, source line-6 373. Source line-6 373 starts off in the third position horizontally in the first section of memory cells 354. Source line-6 373 is in the first position in the second section of memory cells 355. Source line-6 373 is in the fifth position in the seventh section of memory cells 360. Source line-6 373 is in the seventh position horizontally in the tenth section of memory cells 363. Note the vertically straight bit lines are not shown which compliment the source lines in this memory array. However, the bit lines would be interleaved with the source lines and would not be twisted.

Minimizing the consumption of power during a read operation in a memory of a portable device can maximize the amount of battery life.

Figure 4:
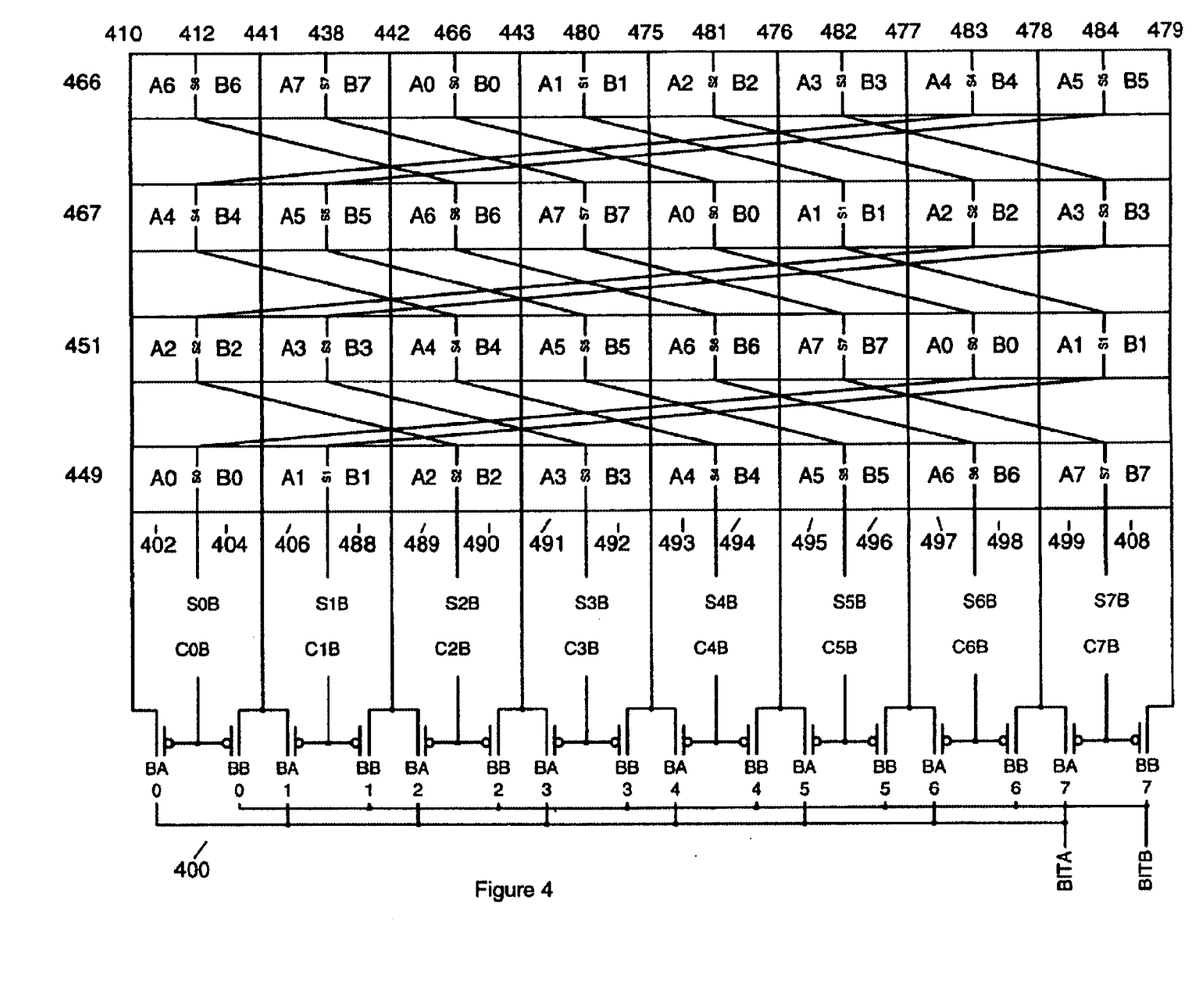
FIG. 4 illustrates an embodiment of a ROM memory array arrayed in a plurality of rows and columns with groups of bit cells created by the twisted source lines.

FIG. 4 illustrates an embodiment of a ROM memory array arrayed in a plurality of rows and columns with groups of bit cells created by the twisted source lines. The ROM array 400 may have, for example, nine bit lines 410, 441–443, 475–479, eight twisted source lines labeled s0–s7 412, 438, 466, 480–484, and sixteen columns of bit cells 402, 404, 406, 408, 488–499. The first memory column 402 may have four groups of memory bits 449, 451, 466, 467.

One or more bit cells in the first group of bit cells 449 connect to a first bit line 410 and a first source line 412. One or more bit cells in a second group of bit cells 451 connect to the first bit line 410 and a second source line 483. One or more bit cells in the third group of bit cells 467 connect to the first bit line 410 and a third source line 481. One or more bit cells in the fourth group of bit cells 466 connect to the first bit line 410 and a fourth source line 466.

A first twisted cell (not shown} may route the first source line 412 over at least two memory columns, such as columns 404, 408, 488, and 489, prior to aligning the first source line to run parallel to the first memory column 402 and the subsequent memory column 489.

Figure 5:
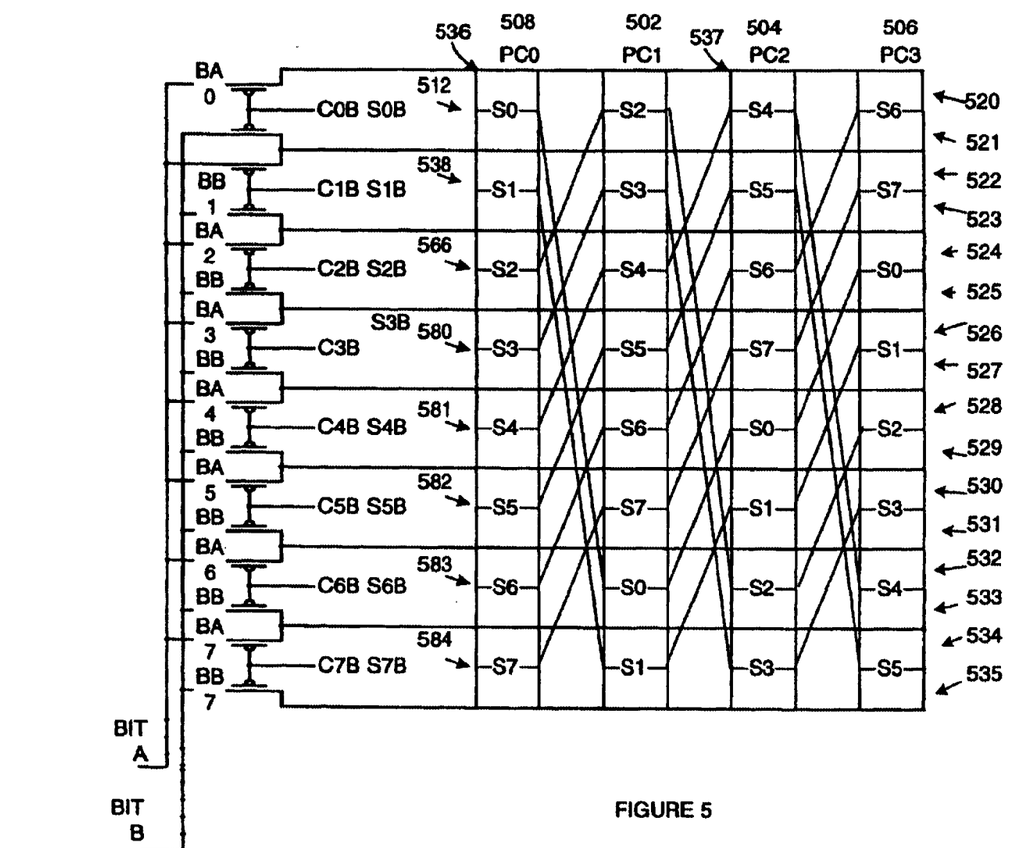
FIG. 5 illustrates an embodiment of a ROM memory array arrayed in a plurality of rows and columns with groups of bit cells formed from the twisted source lines orthogonal to the memory columns in the ROM array.

FIG. 5 illustrates an embodiment of a ROM memory array arrayed in a plurality of rows and columns with groups of bit cells formed from the twisted source lines orthogonal to the memory columns in the ROM array. The ROM array may have, for example, eight twisted source lines labeled s0–s7 512, 538, 566, 580–584, and four columns of bit cells 502, 504, 506, 508. The first memory column 506 may have sixteen groups of bit cells 520–535.

In an embodiment, source lines may be aligned parallel to word lines and orthogonal to bit lines. In an embodiment, bit lines may be aligned parallel to word lines and orthogonal to source lines. In an embodiment, source and bit lines may be aligned orthogonal to word lines. In an embodiment, orthogonal routing architectures may require the least number of lines and less complexity in implementation. In an embodiment, the least amount of lines are twisted because twisting can consume area on a target chip.

The twisted line geometry preserves stored charge in the precharged bit line during a read operation on a given bit cell programmed as a logical one. The twisted line geometry pairs the given bit cell in a first group of bit cells to a first source line and second group of bit cells to a second source line and pairs both groups of bit cells to share the same precharged bit line. Both legs of the given bit cell programmed as a logical one may connect to the same precharged bit line. During the read operation on the given bit cell programmed as a logical one, the bit line should remain at a high voltage state because the given bit cell programmed as a one does not provide a current path to the source line at a low voltage state. The precharged bit line connected to the given bit cell may incur leakage current; however, the amount of leakage current has been limited to bit cells programmed as a zero in the same group as the given bit cell.

The twisted geometry also preserves stored charge in a group of bit cells because if a bit cell is storing charge representing a logical one, then less leakage current paths exist to remove that stored charge. Less leakage path exist to remove the stored charge because fewer bit cells programmed as a zero are in that bit cells group of bit cells than the number bit cells programmed a zero in the entire column of bit cells.

Figure 6A:
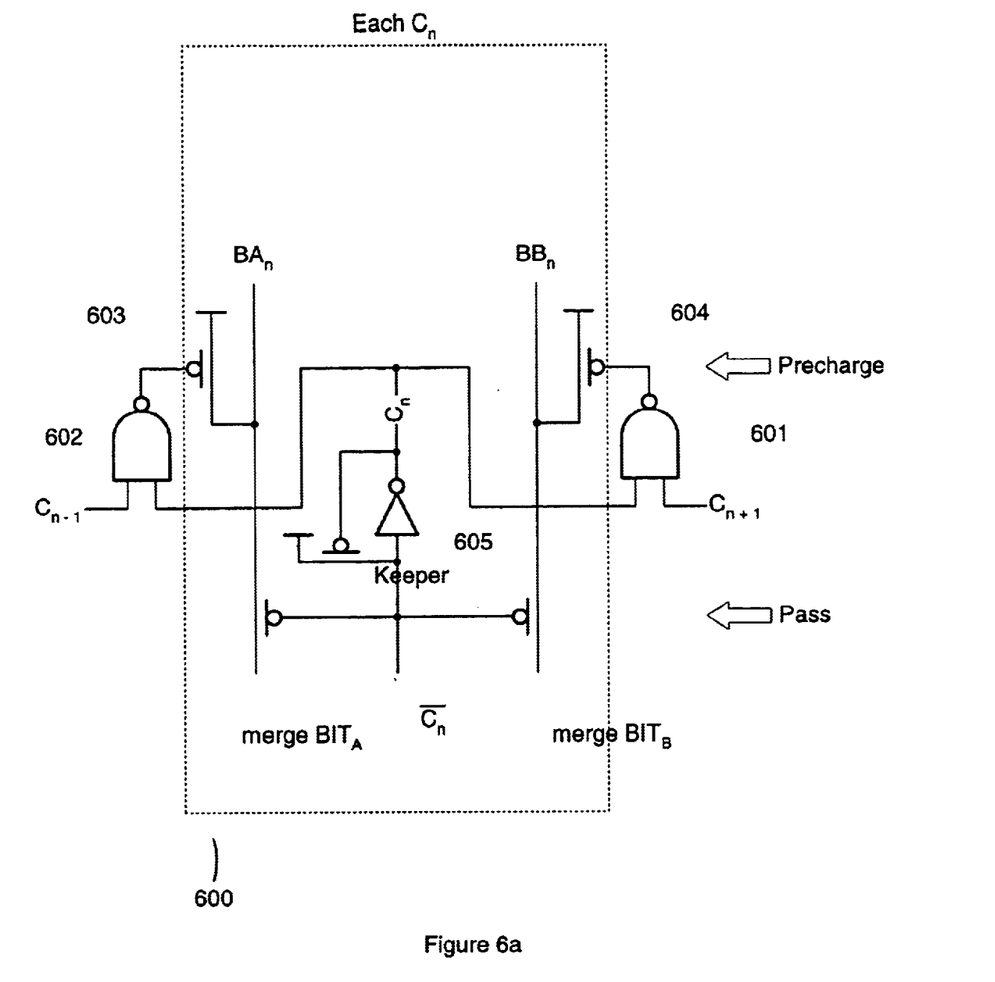
FIGS. 6a, 6b, 6c illustrate an embodiment of a portion of address decoder circuitry operable to generate a signal to change the voltage state of the twisted source lines during a read operation.
Figure 6B:
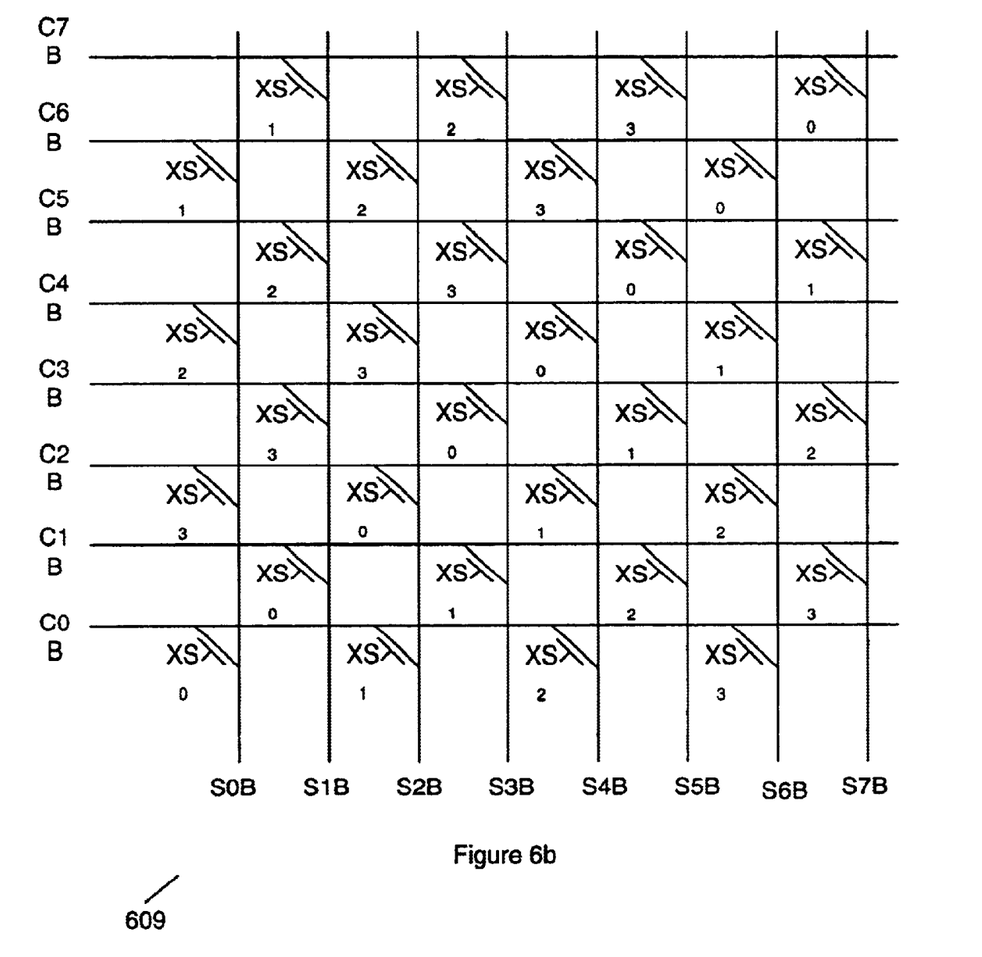
Figure 6C:
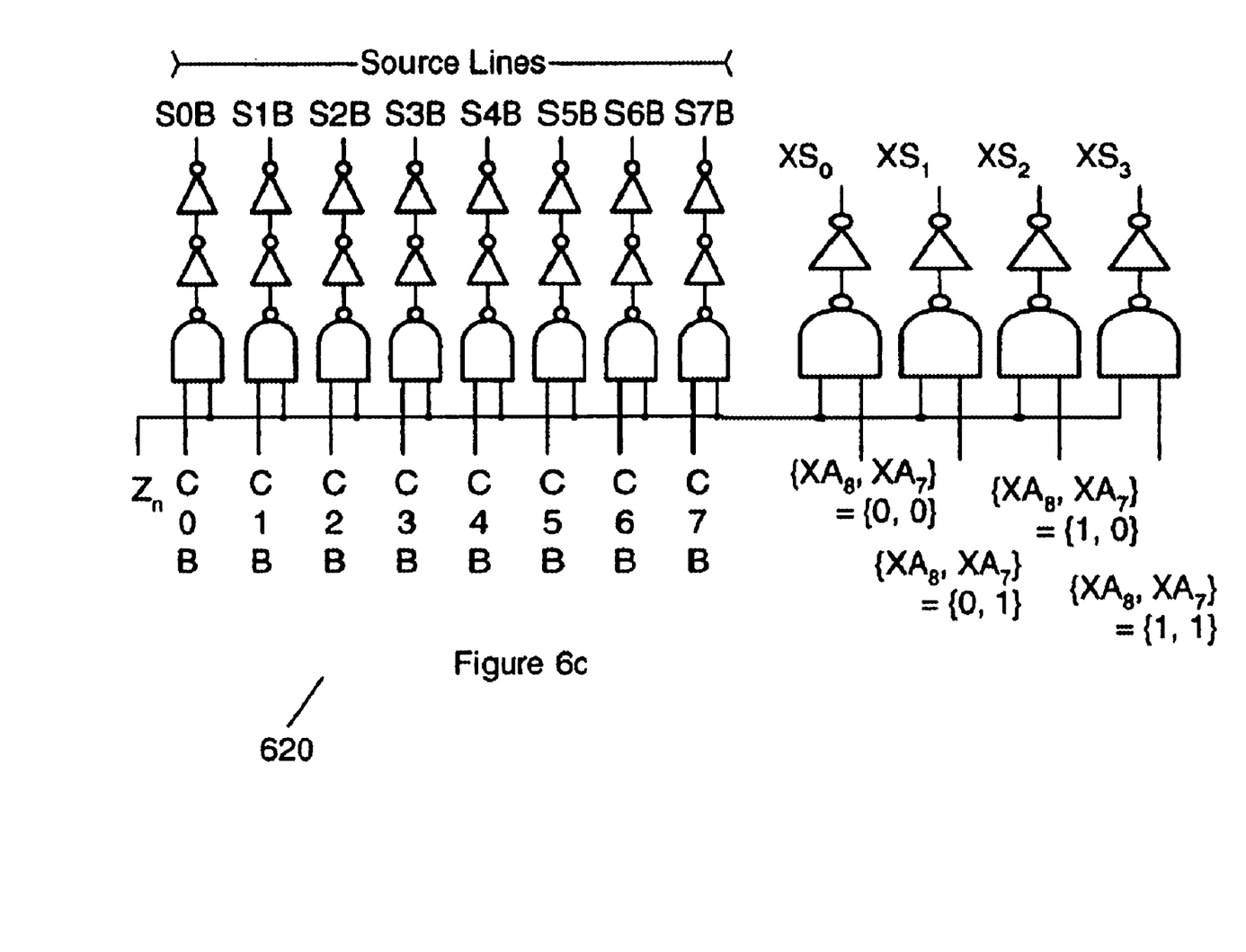

FIGS. 6a, 6b, 6c illustrate an embodiment of a portion of address decoder circuitry operable to generate a signal to change the voltage state of the twisted source lines during a read operation.

FIG. 6a illustrates a portion of an address decoder circuitry 600 having two NAND gates 601, 602 the output of each NAND gate may control a PMOS transistor 603, 604 connecting to a bit line to sense the voltage state of that bit line. The address decoder circuitry 600 may uses outputs BAn and BBn to connect to the various bit lines. An inverter connects to a particular source line depending on the address of the bit cell being read. For example, if bit cell 1 in FIG. 1 is being read then source line 1 connects to this circuit and is brought low. If bit cell 5 in FIG. 1 is being read then source line two connects to this circuit. Similarly, in FIG. 5, if one or more bit cells in the ninth group of memory cells 528 are being read, then connection Cn brings source line S2 low and BA4 and BB4 couple to the address decoders outputs to sense the memory cells in the ninth group. A translation matrix may be used to map the source line to be connected to the circuit depending on the row address of the bit cell being read.

FIG. 6b illustrates an example translation matrix 609 to map the appropriate twisted source line to change its voltage state depending on the column in which the bit cell is being read. For example, in FIG. 5, if a bit cell is being read in the seventeenth group of memory cells 536 in the second column 508 of memory cells then logic in the transfer matrix connects output C0B to line S0B to source line S0 to perform the read operation and change the voltage state of S0. If a bit cell is being read in the eighteenth group of memory cells 537 in the fourth column 504 of memory cells then logic in the transfer matrix output C0B connects S0B to source line S0 to source line S4 to perform the read operation and change the voltage state of S4. The transfer matrix operates similarly for the mapping of a source line to be lowered in voltage state to the address of the bit cell being read.

FIG. 6c illustrates an embodiment of logic 620 to implement a transfer matrix to match a given twisted source line with an address of a memory cell being read.

Figure 7:
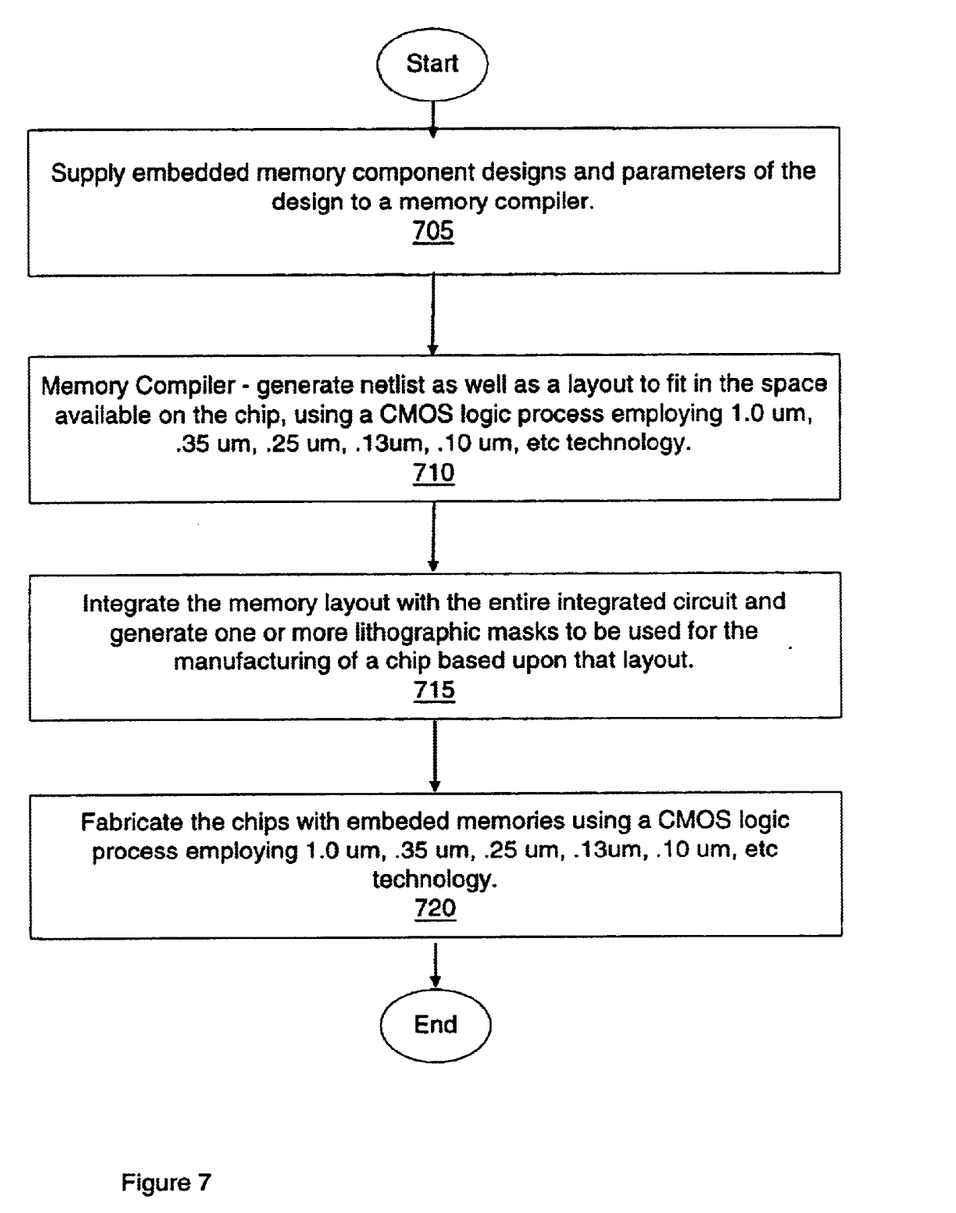
FIG. 7 illustrates an example process of generating an embedded memory from designs of memory components with an embodiment of a memory compiler.

FIG. 7 illustrates an example process of generating an embedded memory from designs of memory components with an embodiment of a memory compiler.

In block 705, the designs for each memory component for the embedded memory are supplied to the memory compiler, as well as other design parameters such as the number of columns and number of rows of the array, the available size on the chip and other parameters. Thus, the designs for one or more a ROM memory arrays having twisted source lines may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip.

In block 710, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory.

In block 715, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The non-volatile memory solution for embedded applications integrates easily with the standard single poly CMOS processes.

In block 720, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the virtual ground non-volatile memory cell compiler is designed for embedded applications in the standard CMOS logic process.

In an embodiment, the chip may be programmed in the back end of the fabrication process using a layer physically higher than the diffusion layer. The ROM memory Compiler may generate instances that may be programmed by a ROM programming tool. The ROM Compiler uses routing and cell architecture that allows designers to create custom designs with just a few metal layers and via masks. The via layer and/or metal layer programmed cells may be completed in the back-end of the manufacturing process. If the programming of the ROM memory isn't made until later or a revision is needed, then the designer merely has to redesign the block, a few metal and via masks, thereby preserving all of the other masks.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

The memory complier outputs may include Behavioral Models and Test Benches (Verilog, VHDL), ●Timing Models (TLF, .Lib and STAMP), Test Models (MemBIST, FastScan), Structural Netlists (EDIF, Spice), Power Models (WattWatcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, the voltage used with the components may be reversed. A bit line may connect and be controlled by the virtual ground circuit. The routing of the source lines and the bit lines in a particular metal layer may change. The metal layers may be replaced with another conductive layer. Source lines may be shared by two or more columns of memory cells. Bit lines may be shared by two or more columns of memory cells. Both the source and bit lines may have a twisted geometry in the same memory array. The invention is to be understood as not limited by the specific embodiments described herein, but only by scope of the appended claims.

I claim:

1. An apparatus, comprising:
   a read only memory arrayed in a plurality of rows and columns;
   a first column of memory cells organized into groups of memory cells including a first group of memory cells and a second group of memory cells;
   a first source line connected to one or more memory cells in the first group of memory cells, the first source line to change its voltage state during a read operation on one or more bit cells in the first group; and
   a second source line connected to one or more memory cells in the second group of memory cells, the second source line to maintain its voltage state during the read operation.

2. The apparatus of claim 1, further comprising:
   a first twisted cell in between a last bit cell in the first group of memory cells and a beginning bit cell in the second group of memory cells.

3. The apparatus of claim 1, further comprising:
   a first twisted cell to break a geometry of the read only memory to create subsections within the first column of memory cells.

4. The apparatus of claim 1, wherein the first source line has a twisted geometry.

5. The apparatus of claim 1, further comprising:
   a first address decoder circuitry operable to generate a signal to change the voltage state of the first source line during the read operation.

6. The apparatus of claim 1, further comprising:
   a first bit line connected to one or more memory cells in the first group and one or more memory cells in the second group.

7. The apparatus of claim 1, wherein the first source line lies orthogonal to the first memory column.

8. A read only memory array, comprising:
   a plurality of bit cells organized into groups of bit cells;
   one or more bit cells in a first group of bit cells connect to a first source line and a first bit line;
   one or more bit cells in a second group of bit cells connect to the first source line and a second bit line;
   one or more bit cells in a third group of bit cells connect to the first source line and a third bit line; and
   a first twisted cell to break the geometry of the read only memory array to create groups of bit cells within a first column of bit cells.

9. The read only memory array of claim 8, further comprising:
   a virtual ground circuit to change the first source line from a same voltage state as the first bit line to a different voltage state than the voltage state of the first bit line when a read operation is initiated on a first bit cell in the first group of cells.

10. A method, comprising:
    performing a read operation on a first bit cell in a column of bit cells, wherein all of the bit cells in the column of bit cells share a common bit line; and
    preserving stored charge in a first group of bit cells in the column of bit cells during the read operation by pairing the first bit cell to a first source line and the first group of bit cells to a second source line.

11. The method of claim 10, further comprising:
    changing a first voltage state of the first source line during the read operation while maintaining a second voltage state of the second source line during the read operation.

12. An apparatus, comprising:
    means for performing a read operation on a first bit cell programmed as a logical one in a column of bit cells, wherein all of the bit cells in the column of bit cells share a common precharged bit line; and
    means for preserving stored charge in the precharged bit line during the read operation on the first bit cell by pairing the first bit cell to a first source line and the first group of bit cells to a second source line.

13. The apparatus of claim 12, further comprising:
    means for changing a first voltage state of the first source line during the read operation while maintaining a second voltage state of the second source line during the read operation.

14. The apparatus of claim 12, wherein the first source line has a twisted geometry.

15. A machine readable medium that stores data representing an integrated circuit, comprising:
    a read only memory arrayed in a plurality of rows and columns;
    a first column of memory cells organized into groups of memory cells including a first group of memory cells and a second group of memory cells;
    a first source line connected to one or more memory cells in the first group of memory cells, the first source line to change its voltage state during a read operation on one or more bit cells in the first group; and
    a second source line connected to one or more memory cells in the second group of memory cells, the second source line to maintain its voltage state during the read operation.

16. The machine readable medium of claim 15, wherein the machine readable medium comprises a memory compiler to provide a layout utilized to generate one or more lithographic masks used in the fabrication of the read only memory.

17. The machine readable medium of claim 16, wherein the integrated circuit further comprises:
    a first twisted cell in between a last bit cell in the first group of memory cells and a beginning bit cell in the second group of memory cells.

18. The machine readable medium of claim 16, wherein the first source line has a twisted geometry.

19. The machine readable medium of claim 18, wherein the integrated circuit further comprises:
    a first twisted cell to route the first source line over at least two memory columns prior to aligning the first source line to run parallel to that memory column.

20. The machine readable medium of claim 16, wherein the integrated circuit further comprises:
    a first bit line connected to one or more memory cells in the first group and one or more memory cells in the second group.

* * * * *